United States Patent
Botma

(12) United States Patent (10) Patent No.: US 7,116,400 B2
(45) Date of Patent: Oct. 3, 2006

(54) ILLUMINATION ASSEMBLY, METHOD FOR PROVIDING A RADIATION BEAM, LITHOGRAPHIC PROJECTION APPARATUS AND DEVICE MANUFACTURING METHOD

(75) Inventor: Hako Botma, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 181 days.

(21) Appl. No.: 10/858,409

(22) Filed: Jun. 2, 2004

(65) Prior Publication Data

US 2005/0270510 A1    Dec. 8, 2005

(51) Int. Cl.
*G03B 27/42* (2006.01)

(52) U.S. Cl. .............. 355/53; 355/67; 355/71

(58) Field of Classification Search ............ None
See application file for complete search history.

(56) References Cited

U.S. PATENT DOCUMENTS

| | | | |
|---|---|---|---|
| 5,138,478 A * | 8/1992 | Ogawa | 359/204 |
| 5,982,476 A * | 11/1999 | Uematsu | 355/67 |
| 6,219,179 B1 * | 4/2001 | Nielsen et al. | 359/386 |
| 6,249,351 B1 * | 6/2001 | de Groot | 356/512 |
| 6,597,430 B1 * | 7/2003 | Nishi et al. | 355/53 |
| 2002/0109827 A1 * | 8/2002 | Nishi | 355/53 |
| 2004/0263817 A1 * | 12/2004 | Tanitsu et al. | 355/67 |

* cited by examiner

*Primary Examiner*—D. Rutledge
(74) *Attorney, Agent, or Firm*—Pillsbury Winthrop Shaw Pittman LLP

(57) ABSTRACT

The invention relates to an illumination assembly, including a beam expander being arranged for receiving from a radiation source a radiation beam directed in a first direction (z) and for expanding the beam with a first magnification factor in a second direction (x) and with a second magnification factor in a third direction (y). The first, second and third directions being substantially mutually orthogonal. The illumination assembly further includes a beam splitter that is arranged for splitting the radiation beam in two split radiation beams split in at least one of the second and third direction, the propagation direction of the split radiation beams being substantially in the first direction. The beam splitter is further arranged for delivering the split radiation beams to the beam expander, of which at least one of the magnification factors is adjustable.

28 Claims, 5 Drawing Sheets

ILLUMINATION ASSEMBLY, METHOD FOR PROVIDING A RADIATION BEAM, LITHOGRAPHIC PROJECTION APPARATUS AND DEVICE MANUFACTURING METHOD

FIELD OF THE INVENTION

The present invention relates generally to lithographic apparatus and more particularly to such apparatus incorporating an illumination assembly and methods for their use.

BACKGROUND OF THE INVENTION

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to devices that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

In order to allow accurate imaging of the mask to the substrate, the light from a radiation source is focused in a pupil plane by an illuminator, to allow optimal illumination of the patterning, as will be discussed in more detail below. The illuminator establishes a predetermined light distribution in the pupil plane, using among other things a diffractive optical element. Such light distributions in the pupil plane are referred to as illumination modi. Examples of illumination modi are: conventional illumination corresponding to an on-axis disk-shaped rotationally symmetric pupil distribution, annular illumination corresponding to a ring-shaped pupil distribution, dipole illumination corresponding to two off-axis poles, or quadrupole illumination corresponding to four off-axis poles. A recent development is the use of a so called low sigma illumination mode, which is similar to conventional illumination except for the radius of the disk-shaped (or top-hat) distribution which is relatively small.

In order to ensure accurate imaging of the patterning device on the substrate, in the pupil plane the light distribution in the x direction is preferably equal to the light distribution in the y direction (x and y taken perpendicular to the optical axis z, and perpendicular with respect to each other).

Often a laser source is used as a radiation source for generating the electromagnetic radiation needed. Such laser sources usually produce a relatively narrow, collimated laser beam, with a relatively small divergence. It is however observed that the divergence in the x direction is often different than the divergence in the y direction. Especially when a beam expander is used to expand the laser beam to a beam with a convenient cross-section, and the magnification in the x-direction differs from that in the y-direction, then the divergence in the x-direction may become even more different than the divergence in the y-direction. The divergence of the beam results in a spread out of the light in the pupil plane, i.e. the pattern in the image plane is somewhat blurred with respect to the pattern that would have been produced by an ideally collimated light beam.

Further, since the divergence in the x direction is different from the divergence in the y direction, this also results in an uneven light distribution in the pupil plane. If, for instance, a ring shaped illumination mode is chosen, the difference in the x and y divergence of the laser beam results in different intensity profiles in the pupil plane in the x and y direction. Not only the shape of the intensity profile will differ, but also the absolute intensities between corresponding positions in the x and y profile.

This has negative effects on the projection of the patterning device on the substrate as will be understood by a person skilled in the art. It might for instance result in uneven imaging results on the substrate for pattern lines elongated in both the x and y direction.

U.S. Pat. No. 6,583,855 B2 in the name of the applicant describes several solutions for solving anomalies of intensity distribution in a plane perpendicular to the optical axis of the radiation system or the projection system. The document describes to counteract anomalies by changing the orientation of a diffractive optical element, which is normally positioned in between the laser source and the pupil plane, as will be explained in further detail below. According to an alternative solution anomalies are counteracted by forming the diffractive optical element of non-regular hexagonal microlenses, stretched along one axis to introduce a predetermined ellipticity error to correct for ellipticity errors caused by other elements.

U.S. Pat. No. 6,583,855 B2 further describes other solutions to the identified problem, such as using a filter in the path of the projection beam, which is partially transmissive to radiation of the projection beam, where said partially transmissive filter has a transmission distribution which counteracts said anomalies in the pupil plane.

The disadvantage of the solutions presented in U.S. Pat. No. 6,583,855 B2 is that all need to be arranged and adjusted specially for a specific source. The adjustments made to the diffractive optical element need to be specifically designed for a certain radiation source of which the difference in divergence between the x and y is known. Also, the use of a transmissive filter requires special adjustment to one specific radiation source.

SUMMARY

It is an object of the present invention to provide a solution to the identified problem, that is flexible in that it may be adjusted to the specifications of the source of radiation used.

This and other objects are achieved according to the invention in an illumination assembly specified in the opening paragraph, wherein the illumination assembly further comprises a beam splitter that is arranged for splitting the radiation beam in two split radiation beams split in at least one of the second and third direction, the propagation direction of the split radiation beams being substantially in the first direction, and for delivering the split radiation beams to the beam expander, of which at least one of the magnification factors is adjustable.

By splitting the radiation beam in, for instance, the second direction, with a given spacing between the two split beams, the magnification factor of the beam expander in that direction may be lowered while still providing the same outer dimensions of the beam. Since a decrease in magnification factor will increase the divergence of the expanded beam as delivered by the beam expander, the divergence difference of the expanded beam in the x and y direction can be reduced in an absolute and/or relative sense. It will be appreciated by a person skilled in the art that the same increase in divergence could be obtained by lowering the magnification factor of the beam expander and thereby decreasing the outer dimensions of the beam, but this has a major disadvantage as will be outlined below. It is known from simulations that any beam size increase in the x-direction leads to a larger polewidth in the y-direction, whereby the polewidth is defined as the size of a pole (or intensity region) in the pupil plane. Similarly, any beam size increase in the y-direction leads to a larger polewidth in the x-direction. A difference in beam size in x and y will therefore result in a difference in polewidth in x and y, which would result in the undesired situation of different imaging characteristics for patterns oriented in the x and y direction. The preferred situation is having equal polewidths in x and y, corresponding to more or less equal beam dimensions in x and y. The beam-splitter according to the present invention is able to adjust the beam size in a certain direction without modifying the beam divergence, and is therefore able to equalize the polewidth in x and y while also keeping the divergence of the beam in x and y equal.

One basic design of beam expander is embodied by a negative (cylindrical) lens followed by a positive (cylindrical) lens. The magnification factor of such an arrangement depends on the optical powers (focal distances) of the lenses used. Therefore, if single lenses with fixed focal distances are used, the magnification factor of such a beam expander will be fixed. The magnification factor can be adjusted however by replacing one of the (cylindrical) lenses from for instance a library of different lenses. Whenever this text refers to the adjustment of the magnification factor of the beam expander this should be explained as also including the exchange of beam expander lenses.

According to an embodiment of the invention the beam splitter is arranged for adjusting the distance between the split radiation beams in at least one of the second and third direction. By adjusting the separation distance between the two split radiations beams, the required magnification of the beam expander in the direction of separation may be adjusted and thus also the difference between the divergence in the x and y direction may be adjusted, while keeping the same beam size.

According to an embodiment of the invention the beam splitter is formed by an axicon, comprising a first part and a second part. The axicon is preferably a linear wedge-shaped axicon. This is a simple and cost effective way of providing a beam splitter, that can easily be adjusted to provide two separate beams with a predetermined distance.

According to an embodiment of the invention an intermediate distance between the first part and the second part is adaptable for adjusting the distance between the split radiation beams in at least one of the second and third direction. This is an easy method to adjust the distance between the split radiation beams.

According to an embodiment of the invention the axicon is rotatable with respect to the first direction, for splitting the radiation beam in either the second or the third direction. By rotating the beam splitter, the direction in which the received radiation beams are split can easily be adjusted.

According to an embodiment of the invention the axicon is made of calcium-fluoride.

This material has a relatively high translucency with respect to radiation, especially with respect to the wave length generated by the laser source. The material is further resistant to the high intensities of radiation that may occur.

According to a further aspect, the invention relates to a lithographic apparatus, comprising an illumination assembly as described above.

According to a further aspect, the invention relates to a lithographic apparatus comprising:

an illumination system for providing a projection beam of radiation, the illumination system comprising a beam expander being arranged for receiving from a radiation source a radiation beam directed in a first direction and for expanding the beam with a first magnification factor in a second direction and with a second magnification factor in a third direction, the second and third directions being substantially perpendicular with respect to the first direction and with respect to each other;

a support structure for supporting a patterning device, the patterning device serving to impart the projection beam with a pattern in its cross-section;

a substrate table for holding a substrate; and a projection system for projecting the patterned beam onto a target portion of the substrate, wherein the illumination system further comprises a beam splitter that is arranged for splitting the radiation beam in two split radiation beams split in at least one of the second and third direction, the propagation direction of the split radiation beams being substantially in the first direction (z), and for delivering the split radiation beams to the beam expander, of which at least one of the magnification factors is adjustable.

According to a further aspect, the invention relates to a method for providing a radiation beam, comprising the following:

providing by a radiation source (SO) the radiation beam propagating in a first direction, expanding the radiation beam with a beam expander, having a first magnification factor in a second direction and having a second magnification factor in a third direction, the second and third direction being substantially perpendicular with respect to the first direction and with respect to each other, wherein the method further comprises:

splitting the radiation beam in two split radiation beams in at least one of the second and third direction, the propagation direction of the split radiation beams being substantially in the first direction, and delivering the split radiation beams to the beam expander, whereby at least one of the magnification factors of the beam expander is adjustable.

According to a further aspect, the invention relates to a beam splitter arranged for splitting a radiation beam directed in a first direction in two parallel radiation beams directed in the first direction, wherein the beam splitter is further arranged for delivering the split radiation beams to a beam expander arranged in a lithographic projection apparatus.

According to a further aspect, the invention relates to a method for providing a radiation beam, the method comprising:

arranging a beam splitter for receiving a radiation beam from a radiation source, the radiation beam being directed in a first direction, and for splitting the received radiation beam into two split radiation beams separated in at least one of a second and third direction, the second and third directions each being substantially perpendicular with respect to the first direction and with respect to each other, the split radiation beams being directed substantially in the first direction;

determining a divergence of the radiation beam from the radiation source in the second and third direction respectively;

determining which one of the determined divergences has the largest value and which the smallest;

adjusting the orientation of the beam splitter;

determining the absolute difference between the values of the divergences;

determining the distance in between the split radiation beams in the second and third direction; and adjusting the beam splitter and the beam expander in accordance with the determined distance in between the split radiation beams, for reducing the difference between the divergences.

According to an embodiment of the invention, the direction in which the beam splitter splits the radiation beam is adjustable by rotating the beam splitter with respect to the first direction.

According to an embodiment of the invention, the beam splitter is an axicon comprising a first part and a second part and a distance between the split radiation beams is adjustable by adjusting a distance in the first direction between the first part and the second part.

According to a further aspect, the invention relates to a device manufacturing method comprising the steps of:

providing a substrate;

providing a projection beam of radiation using an illumination system;

using a patterning device to impart the projection beam with a pattern in its cross-section;

projecting the patterned beam of radiation onto a target portion of the substrate; and performing the method as described above.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS

Figure 1:
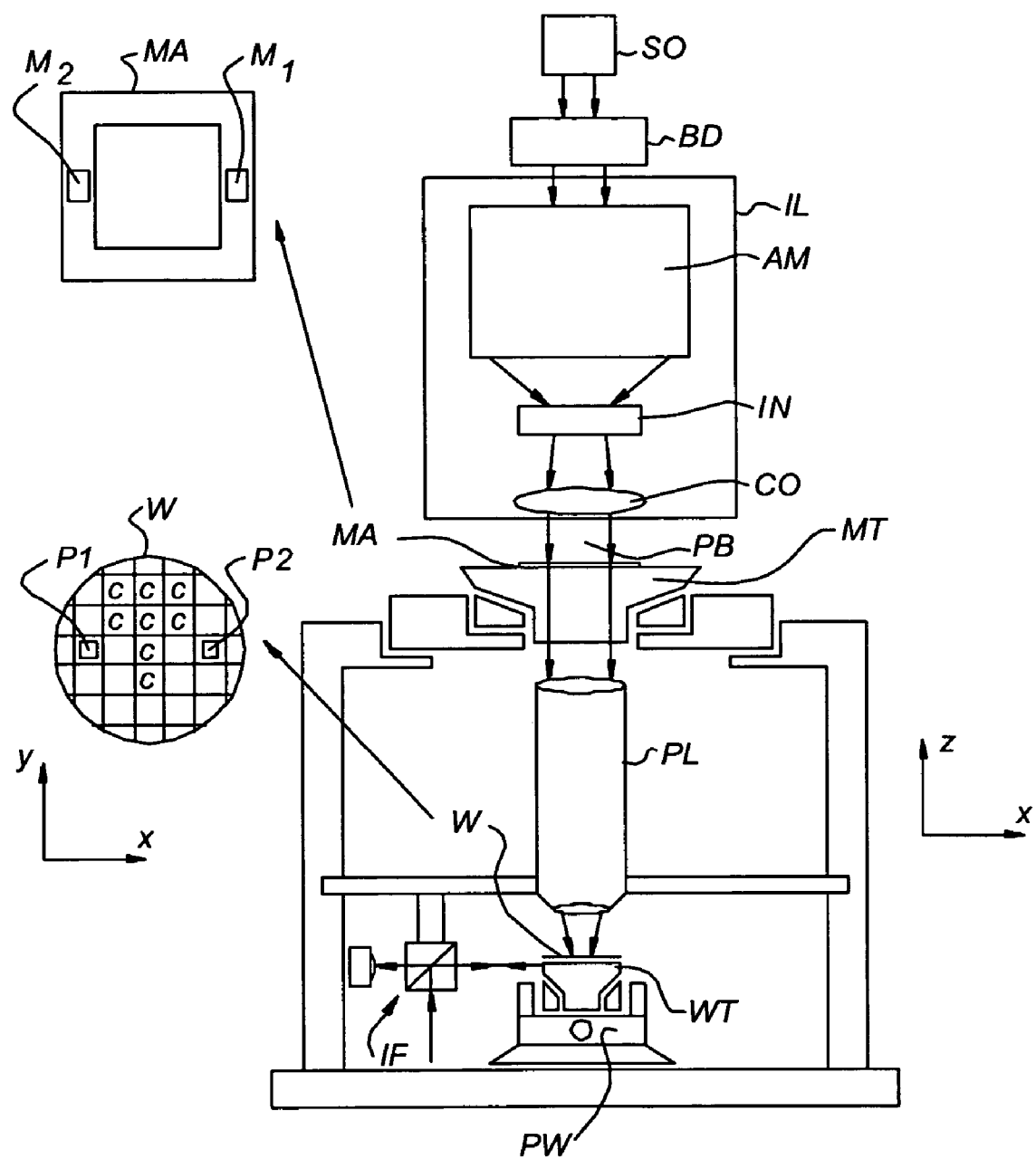
FIG. 1 schematically depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting a patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by patterning means MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjustable optical elements AM for adjusting the angular intensity distribution of the beam. Generally, at least the outer and/or inner radial extent (commonly referred to as sigma-outer and sigma-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioner PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
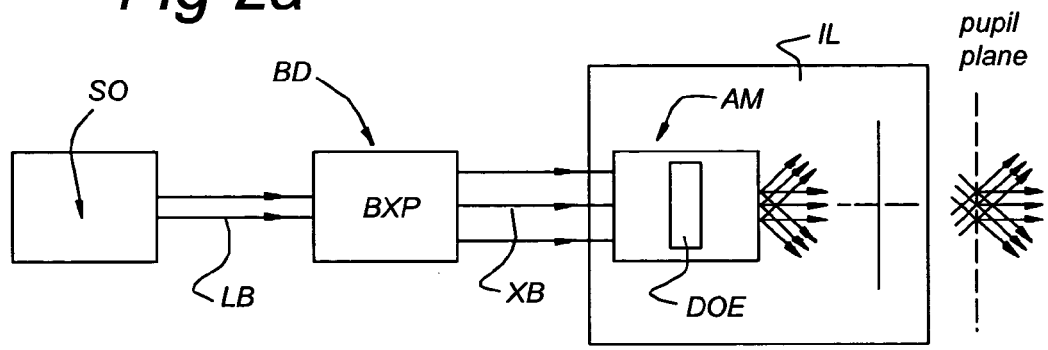
FIG. 2a schematically depicts a radiation system including an illuminator used in a lithographic projection apparatus according to the state of the art.
Figure 2B:
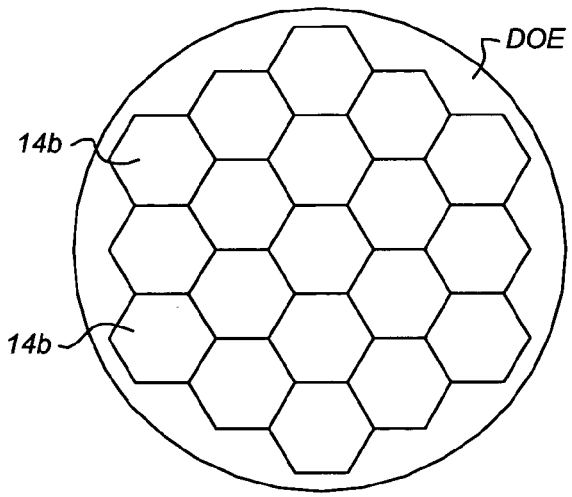
FIG. 2b schematically depicts a diffractive optical element used in an lithographic projection apparatus.

FIGS. 2a and 2b provide a more schematic view of the radiation system including the illuminator. The source SO is e.g. provided by an excimer laser (not shown), that delivers a laser beam LB to the beam delivery system BD, in this case formed by a beam expander BXP. The beam expander BXP expands the laser beam received in the x and y direction (x and y being substantially perpendicular to the direction of propagation of the laser beam). The expansion (or magnification) can be adjusted in the x and y direction independently with respect to each other. The beam expander BXP delivers an expanded beam XB to the illuminator IL, the expanded beam having a substantially rectangular shaped cross section. Since the beam expander BXP is capable of adjusting the magnification in the x and y direction independently, the dimensions of the expanded laser beam can be adjusted to the specifications of the illuminator IL. After passing the beam expander BXP, the expanded laser beam is substantially collimated.

The illuminator IL comprises, among other things already discussed above, adjustable optical element AM, for adjusting an angular intensity distribution of the beam. According to this embodiment this is done by a diffractive optical element DOE.

Such a diffractive optical element DOE may be formed by a closely packed array of (e.g. hexagonal) microlenses 14b, shown in FIG. 2b. The diffractive optical element DOE provides an angular distribution to the beam and helps to define the pupil shape in the pupil plane. The diffractive optical element DOE shown is only an example of a possible diffractive optical element. It will be understood that also other optical elements may be used to generate the pupil, e.g. refractive or reflective optical elements.

The diffractive optical element DOE diffracts the substantial collimated beam received from the source SO and the beam delivery system BD. The diffracted beam as delivered by the diffractive optical element DOE is no longer collimated, but provided with angles (for instance up to 25 mrad). Such an angled light beam is needed to use the maximal achievable numerical aperture allowed by the system and thus to enable optimal imaging, as will be understood by a person skilled in the art.

Figure 3:
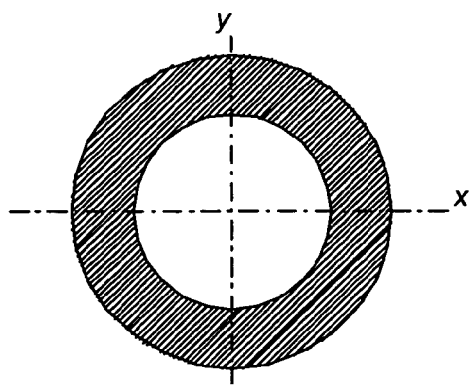
FIG. 3 schematically depicts a light profile in a pupil plane.

The illuminator IL is arranged to provide a desired illumination modus in the pupil plane. Various illumination modi are knows, such as dipole or quadrupole illumination modi. FIG. 3 schematically shows a rotational symmetrical illumination mode known as annular illumination. The theory and advantages of the different illumination modes are known to a person skilled in the art. The source SO outputs a relatively narrow beam, that is directed to the beam expander BXP. Ideally, the beam expander BXP outputs a collimated beam, however, (at the edges of the beam) there may be a divergence. This is due to the fact that in practice the beam as generated by the source SO, is not a perfectly collimated beam, but also possesses a small divergence in the x and y direction. This divergence is thus also present in the beam as delivered by the beam expander BXP.

It is known that the divergence of the beam as generated by the source SO in the x direction may be different from the divergence of the beam in the y direction. This may lead to a divergence difference as delivered by the beam expander BXP of up to several mrad between the x and y directions. Such a difference in the x and y divergence causes differences in the intensity distribution of the light in the pupil plane in the x and y direction, as already discussed above. Such anomalies in the light distribution in the pupil plane cause uneven illumination of the patterning device, leading to imperfect projection of those patterning device on a substrate, or on a projection plane.

The effect of the beam expander BXP will be explained by an example. For instance, the source SO generates a beam having a rectangular cross-sectional area in the x and y direction, of, say, 11 mm×11 mm, and having a divergence in the x direction of $div_{x,in}$=0.5 mrad and a divergence in the y direction of $div_{y,in}$=1.2 mrad. The divergences of the beam generated by the source SO may be different for each actual source. There are several techniques known to a person skilled in the art to measure these divergence, such as the use of a far-field camera. More information about this may be found on the web-site of U.S. lasercorp (www.uslasercorp.com).

Figure 5A:
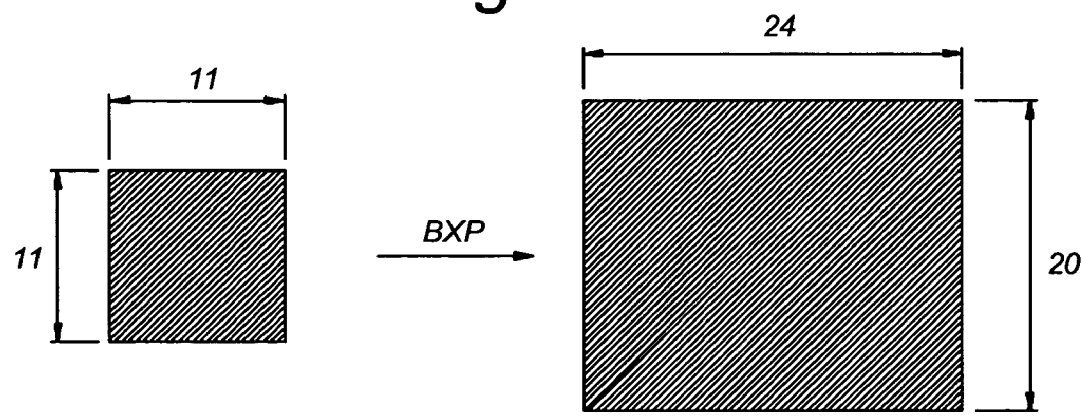
FIGS. 5a and 5b schematically depict cross-sectional views of light beams.

The beam expander BXP for instance magnifies the laser beam LB to an expanded beam XB having rectangular cross-sectional dimensions of 24 mm in the x direction and 20 mm in the y direction, as is shown in FIG. 5a. Usually, these dimensions are dictated by the dimensions of the entrance of the illuminator IL. The beam expander BXP thus has a magnification factor in the x direction $M_x$ equal to 2.18 (=24/11) and a magnification factor in the y direction My equal to 1.82 (=20/11).

The beam expander BXP also influences the divergence. The beam delivered by the beam expander has a divergence $div_{out}$ that is equal to the divergence that enters the beam expander $div_{in}$ divided by the magnification factor M, so for the x direction: $div_{x,out}=div_{x,in}/M_x$ and for the y direction: $div_{y,out}=div_{y,in}/M_y$.

Thus, the divergences delivered by the beam expander in this case are: $div_{x,out}$=0.23 mrad 0.5/2.18) and $div_{y,out}$=0.66 mrad (=1.2/1.82). In this case, the ratio between the divergences in the x and y direction is about three: $div_{y,out}/div_{x,out}$≈3 (≈0.66/0.23). This means for example that in the prior art a narrow line of a given desired width in the x direction will be projected with a projected width different from the projected width of an identical narrow line in the y direction.

Figure 4A:
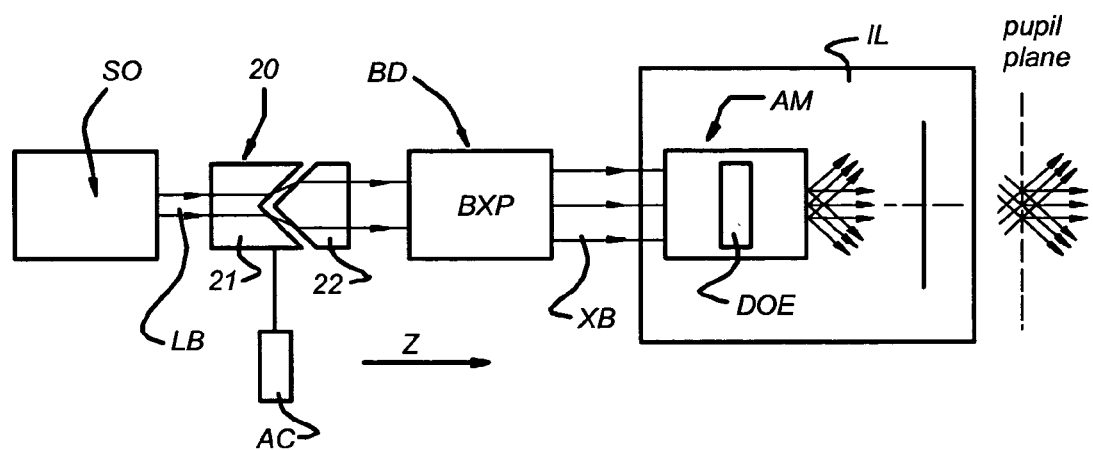
FIG. 4a schematically depicts a radiation system including an illuminator used in a lithographic projection apparatus according to an embodiment of the invention.

The invention provides a solution for the identified problem by positioning a linear, wedge-shaped axicon 20 in between the source SO and the beam expander BXP, as shown in FIG. 4a. Same reference numbers are used to refer to the same elements as in FIG. 2. The axicon can be used to reduce the divergence difference between the x and y divergence, as will be explained below.

Figure 4B:
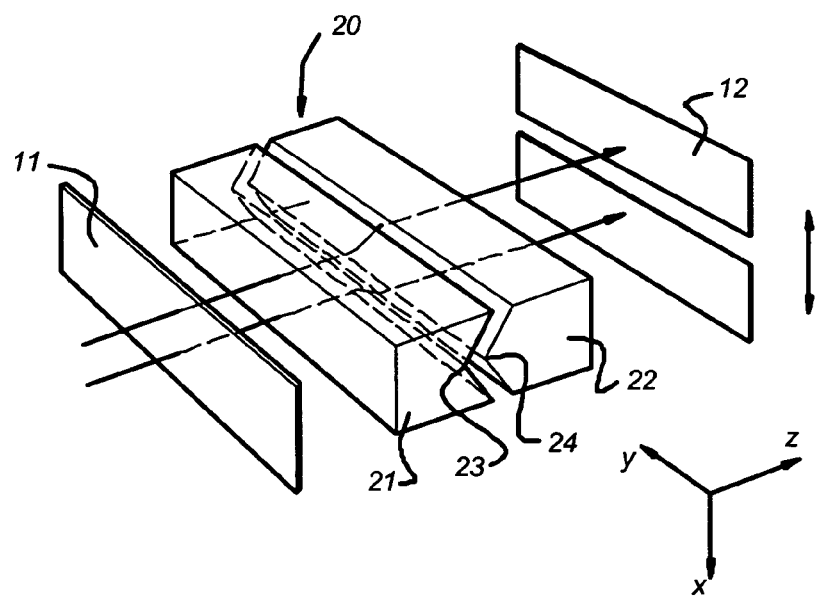
FIG. 4b schematically depicts an axicon according to an embodiment of the invention.

The axicon 20 is shown in more detail in FIG. 4b, which provides a perspective view of the axicon 20. The axicon comprises a first part 21 and a second part 22, that are moveable with respect to each other in the z direction. The surfaces of the first part 21 and the second part 22 of the axicon that are facing each other have a shape as shown in FIG. 4b and are substantially parallel with respect to each other. The surface of the first part 21 facing the second part 22 is provided with a triangular shaped notch. The deepest part of the notch is formed by a first edge 23, according to the example shown in FIG. 4b extending in the y direction. The surface of the second part 22 facing the first part 21 is provided with a triangular shaped bulge. The highest part of the bulge is formed by a second edge 24, according to the example shown in FIG. 4b extending in the y direction.

In case the spacing between the first part 21 and the second part 22 is reduced to zero by moving the first part 21 and the second part 22 with respect to each other in the z direction, the surfaces of the parts 21, 22 facing each other will exactly fit in each other, the first part 21 and the second part 22 together forming a three dimensional rectangular body.

The effect of the axicon 20 can be explained with reference to FIG. 4b, that further shows a cross-section of the beam 11 generated by the source SO that enters the axicon 20, and a cross section of the beam 12 that is delivered by the axicon 20.

The axicon 20 is positioned in such a way that the first edge 23 and the second edge 24 are aligned with respect to each other and are aligned with respect to the center of the beam LB generated by the source SO. The beam generated by the source enters the first part and is split in two split beams by the surface of the first part 21 facing the second part 22. The surface of the second part 22, facing the first part 21, redirects the two beams and makes them substantially parallel to the z direction. The axicon 20 thus delivers two parallel beams, each having a rectangular cross-section. The total cross-sectional area of the two split beams delivered by the axicon 20 equals the cross sectional area of the beam LB generated by the source SO.

Figure 5B:
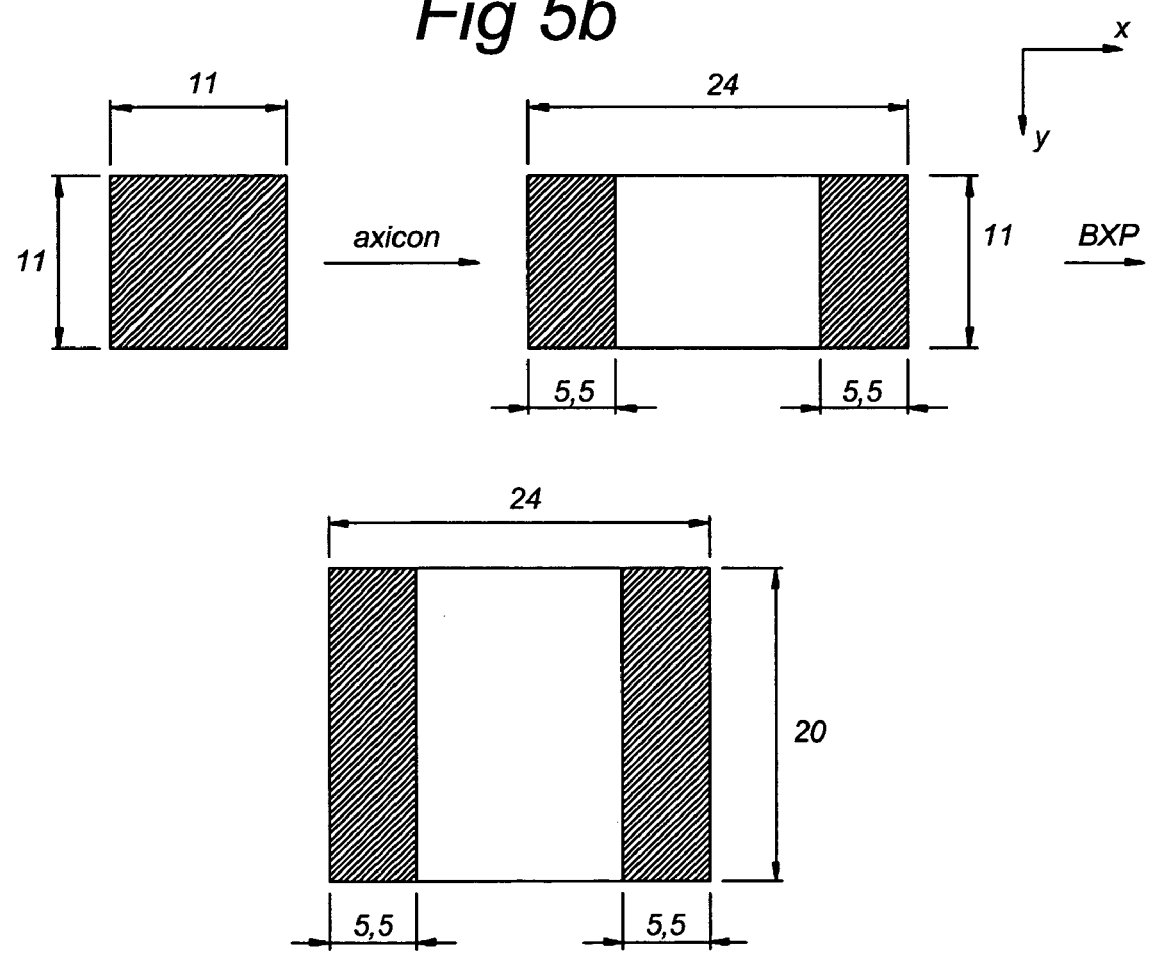

FIG. 5b depicts an example, showing a cross section of a beam LB generated by the source SO, having the same specifications as the beam discussed in the example above with reference to FIG. 5a: having a rectangular cross sectional dimensions in the x and y direction, of 11 mm×11 mm, and having a divergence in the x direction of $div_{x,in}$=0.5 mrad and a divergence in the y direction of $div_{y,in}$=1.2 mrad.

After the beam has passed the axicon, the beam is split into two split beams, each part having a rectangular cross-section with x and y dimensions equal to 5,5 mm and 11 mm respectively. The two parts are positioned in a rectangular shaped area having outer x, y dimensions of 24 and 11 mm respectively, as can be seen in FIG. 5b.

These two parts then go through the beam expander BXP that will expand the split beams in such a way that the two split beams are positioned in a rectangular shaped area having outer dimensions that correspond to the entrance of the illuminator IL, in this case 20×24 mm. Thus, the required magnification in the x direction $M_x$=1 (=24/24), while the required magnification in the y direction $M_y$=1.82 (=20/11). The result of the magnification by the beam expander BXP is also depicted in FIG. 5b. the dimensions are indicated in the figure.

The divergences of the beam delivered by the beam expander BXP can now be calculated:

$$div_{x,out}=div_{x,in}/M_x=0.50 \text{ mrad } (=0.5/1); \text{ and}$$

$$div_{y,out}=div_{y,in}/M_y=0.66 \text{ mrad } (=1.2/1.82).$$

As a result of using the axicon 20, the difference between the divergence in the x and y direction is reduced with respect to the situation described with reference to FIG. 5a. In this case, the ratio between the divergences in the x and y direction is in the order of one: $div_{x,out}/div_{y,out} \approx 1$ ($\approx 0.50/0.66$).

As can be concluded from the description above, the axicon 20 may be used to reduce the difference between the divergence in the x and y direction. It may also be noted that the absolute divergence in the x direction as delivered by the beam expander BXP is now larger than the divergence in the x direction as delivered by the beam expander in the example where no axicon was used. However, the negative effect of this larger divergence is small in comparison with the positive effect of having a ratio between the divergences in the x and y direction as delivered by the beam expander BXP now closer to one.

In the example discussed above, the divergence in the x direction is smaller than the divergence in the y direction. However, in case this would be the other way around, i.e. the divergence in the y direction being smaller than the divergence in the x direction, the axicon 20 could be rotated 90° around the z axis and the same method could be applied with x and y replaced.

It is noted that the axicon 20 changes the shape of the beam, in particular the outer dimensions. In fact, the axicon 20 creates a rectangular shaped hole in the projection beam. However, after the beam has passed the diffractive optical element DOE, this hole will have disappeared. The axicon 20 however does not change the x and y divergences of the beam. Since the outer dimension of the beam is increased in one direction, the magnification factor of the beam expander BXP in that direction should be lowered, resulting in a higher divergence of the beam in that direction as delivered by the beam expander BXP. In the example discussed above, the divergences were not exactly equal to each other, but it will be understood by a person skilled in the art that in other circumstances, this may be possible.

If, for instance, a beam LB is generated by the laser beam with a rectangular cross sectional area with dimensions of 11×11 mm and with a divergences equal to: $div_{x,in}$=0.8 mrad and $div_{y,in}$=1.2 mrad, then the axicon parts of the axicon 20 should be placed with a mutual distance such that the outer dimensions of the two beams generated by it are approximately 19.8×11 mm. The magnification factors then become: $M_x$=1.21 (=24/19.8) and $M_y$=1.82 (=20/11). The divergences of the beam as delivered by the beam expander than become:

$$div_{x,out}=div_{x,in}/M_x=0.66 \text{ mrad } (=0.8/1.21); \text{ and}$$

$$div_{y,out}=div_{y,in}/M_y=0.66 \text{ mrad } (=1.2/1.82).$$

According to this example, the difference between the divergences are reduced to approximately zero, and the ratio between the divergences becomes approximately 1.

It will be understood that the invention provides a simple straightforward solution for decreasing the difference between the divergence in the x and y direction of the laser beam that is delivered to the diffractive optical element DOE. A simple method may be described for carrying out the invention, as presented in FIG. 6.

First, shown in a step 30, the divergences $div_x$ and $div_y$ of the beam generated by the source SO in the x- and y-direction need to be determined. Once these divergences are known, it may be determined which divergence is the largest. This may be done by computing $div_x$–$div_y$ and determine the sign of the result as is done in step 31. If the result is positive ($div_y$ being larger than $div_x$), than the axicon 20 should be positioned such that the first edge 23 and the second edge 24 are aligned in the direction of the y axis. If the result is negative, the axicon should be positioned such that the first edge 23 and the second edge 24 are aligned in the direction of the x axis. Based on the result from step 31, the axicon 20 may be oriented, as is shown in step 32.

In step 33 the absolute difference between the divergences is determined, by computing |$div_x$–$div_y$|, possibly by using the result of step 31. Based on the absolute difference, the distance $z_{axicon}$ between the first part 21 and the second part 22 of the axicon 20 may be determined and adjusted, as is shown in step 34. How to determine the appropriate $z_{axicon}$ is explained in further detail below, with reference to FIG. 7.

Figure 6:
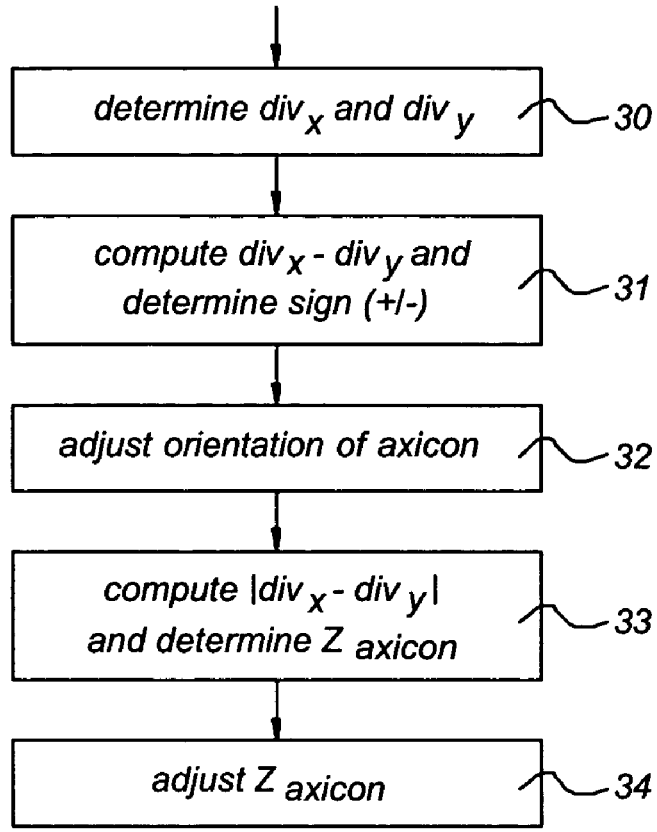
FIG. 6 depicts a block diagram representing a method for carrying out the invention.

It will be understood that the steps presented in FIG. 6 may be carried out in a different order. The method as described with reference to FIG. 6 may be carried out by hand, but may also be carried out by computer or by a controller, as are known to a person skilled in the art.

The axicon 20 according to the invention may further be provided with actuator AC for adjusting the orientation and mutual distance between its parts.

It will be understood by a person skilled in the art that the computer or the controller used for carrying out the steps discussed with reference to FIG. 6 should be provided with at least one input and output for communicating with other devices. The computer or the controller should, for instance, be arranged to receive information about the divergences in the x and y direction of the source SO. This information could be provided to the computer or the controller via a manual input such as a keyboard, but the computer or the controller could also be connected to devices arranged for measuring the divergences. Further on, the computer or the controller may be arranged to control the actuator AC for adjusting the orientation of the axicon 20 and to adjust the mutual distance between the first part 21 and the second part 22 of the axicon 20.

Figure 7:
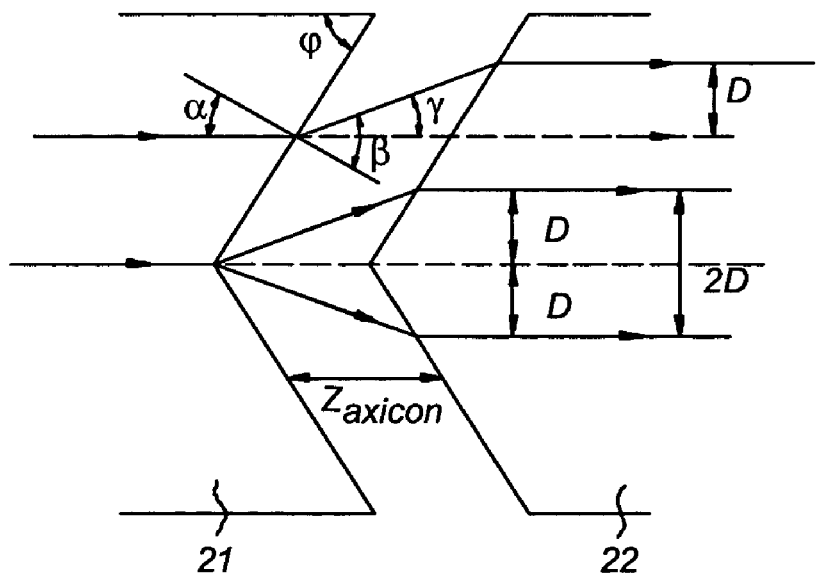
FIG. 7 shows a cross-sectional view of the axicon according to an embodiment of the invention.

FIG. 7 shows a cross-sectional view of the axicon 20. According to this figure it can easily be understood how to compute the appropriate distance $z_{axicon}$ between the first part 21 and the second part 22 in order to obtain a certain required displacement of the beam D. The displacement D is defined as the distance the light beam is displaced in the x or y direction with respect to the position of a beam that did not undergo such a displacement, indicated in FIG. 7 with the dotted line.

In FIG. 7 angle $\phi$ is indicated, as being the sharp angle of the top edge of the first part. This angle (p is a fixed, known parameter. Further, the refractive index of the material of the axicon is known, and is called $n_{axicon}$.

The figure shows that the angle of incidence for a light beam leaving the first part 21 equals $\alpha$, while the angle of refraction equals $\beta$, where:

$$\sin(\beta) = n \sin(\alpha).$$

Also indicated is the angle $\gamma$ of the refracted beam with respect to the undisplaced path, indicated with the dotted line, where $\gamma = \beta - \alpha$. As soon as the appropriate displacement of a light beam as delivered by the axicon 20 is determined, based on the known divergences of the source SO, the required $z_{axicon}$ can now easily be computed:

$$z_{axicon} = \frac{D}{\tan(\gamma)} = \frac{D}{\tan(\beta - \alpha)},$$

which can easily be expressed as a function of n and $\phi$ (with $\alpha = 90° - \phi$ and n–sin $\alpha$=sin $\beta$):

$$z_{axicon} = \frac{D}{\tan(\sin^{-1}(n\sin(90 - \varphi)) - 90 + \varphi)}.$$

It will be understood that part of the beam going through the underside of the axicon will undergo a displacement equal to minus D, so the distance between the two parts of the beam delivered by the axicon 20 equals two times the displacement as computed above: 2*D.

It will further be understood that in case the divergences of the beam in the x and y direction of the source SO are equal to each other, the first part 21 and the second part 22 of the axicon 20 could be positioned against each other ($z_{axicon}=0$) or the axicon 20 could be removed out of the light beam.

The axicon 20 is preferably made of a material that has a relatively high translucency and low absorption with respect to radiation, especially with respect to the wavelength generated by the laser source. The material used should further be resistant to deterioration by the high intensities of radiation that may occur. For that reason, the axicon may for instance be made from calcium-fluoride. It will be understood that the function of the axicon 20 is to split the beam as generated by the source in two split beams. This function may however also be accomplished using other means than the axicon 20, for instance, using a set of mirrors. In general, the invention could be carried out with any beam splitter that is arranged to split the beam in two separate beams.

While specific embodiments of the invention have been described above, it will be appreciated that the invention may be practiced otherwise than as described. The description is not intended to limit the invention.

The invention claimed is:

1. An illumination assembly, comprising:
   a beam expander arranged to receive a radiation beam directed in a first, direction (z) and to expand the beam with a first magnification factor, $M_x$, in a second direction (x) and with a second magnification factor, $M_y$, in a third direction (y), the second and third directions being substantially mutually perpendicular and substantially perpendicular to the first direction, the expander being adjustable to change at least one of $M_x$ and $M_y$; and
   a beam splitter that is arranged to split the radiation beam into two split radiation beams in at least one of the second and third direction, a propagation direction of the split radiation beams being substantially in the first direction, and to deliver the split radiation beams to the beam expander.

2. An illumination assembly according to claim 1, wherein the beam splitter is arranged to adjust a distance between the split radiation beams in at least one of the second and third direction.

3. An illumination assembly according to claim 1, wherein the beam splitter comprises a two-part axicon.

4. An illumination assembly according to claim 3, of which an intermediate distance between a first part and a second part of the two-part axicon is adjustable to change the distance between the split radiation beams in at least one of the second and third direction.

5. An illumination assembly according to claim 3, wherein at least one part of the axicon is rotatable with respect to the first direction, such that the radiation beam is split in either the second or the third direction.

6. An illumination assembly according to claim 3, wherein the axicon comprises calcium-fluoride.

7. A lithographic apparatus, comprising an illumination assembly according to claim 1.

8. A lithographic apparatus comprising:
   an illumination system to condition a projection beam of radiation, the illumination system comprising a beam expander arranged to receive a radiation beam directed in a first direction (z) and to expand the beam with a first magnification factor, $M_x$, in a second direction (x) and with a second magnification factor, $M_y$, in a third direction (y), the second and third directions being substantially mutually perpendicular and substantially perpendicular to the first direction, the expander being adjustable to change at least one of $M_x$ and $M_y$; and
   a beam splitter that is arranged to split the radiation beam into two split radiation beams in at least one of the second and third direction, a propagation direction of the split radiation beams being substantially in the first direction, and to deliver the split radiation beams to the beam expander;

a support to support a patterning device, the patterning device serving to impart the projection beam with a pattern in its cross-section;

a substrate table to hold a substrate; and a projection system to project the patterned beam onto a target portion of the substrate.

9. A lithographic apparatus according to claim 8, wherein the beam splitter is arranged to adjust a distance between the split radiation beams in at least one of the second and third direction.

10. A lithographic apparatus according to claim 9, wherein the beam splitter comprises a two-part axicon.

11. A lithographic apparatus according to claim 10, wherein at least one part of the axicon is rotatable with respect to the first direction, such that the radiation beam is split in either the second or the third direction.

12. A lithographic apparatus according to claim 10, wherein the axicon comprises calcium-fluoride.

13. A method comprising:

providing a radiation beam propagating in a first direction (z);

expanding the radiation beam using a beam expander by a first magnification factor $M_x$ in a second direction (x) and by a second magnification factor $M_y$ in a third direction (y), the second and third directions being substantially mutually perpendicular and substantially perpendicular to the first direction, wherein at least one of $M_x$ and $M_y$ is adjustable;

splitting the radiation beam into two split radiation beams in at least one of the second and third direction, the propagation direction of the split radiation beams being substantially in the first direction; and delivering the split radiation beams to the beam expander.

14. A beam splitter constructed and arranged to split a radiation beam directed in a first direction (z) into two substantially parallel radiation beams directed in the first direction, and to deliver the split radiation beams to a beam expander arranged in a lithographic projection apparatus.

15. A beam splitter according to claim 14, arranged to adjust a distance between the split radiation beams in at least one of a second (x) and a third (y) direction, the second and third directions being substantially mutually perpendicular and substantially perpendicular to the first direction.

16. A beam splitter according to claim 15, comprising a two-part axicon.

17. A beam splitter according to claim 16, wherein at least one part of the axicon is rotatable with respect to the first direction, such that the radiation beam is split in either the second or the third direction.

18. A beam splitter according to claim 16, wherein the axicon comprises calcium-fluoride.

19. A method according to claim 13, wherein splitting the radiation beam further comprises adjusting a distance between the split radiation beams in at least one of the second and third direction.

20. A method according to claim 19, wherein splitting the radiation beam is performed using a two-part axicon.

21. A method according to claim 20, further comprising rotating at least one part of the axicon with respect to the first direction, such that the radiation beam is split in either the second or the third direction.

22. A method for adjusting a beam splitter comprising:

splitting a beam of radiation having a direction of propagation (z) into a pair of split radiation beams;

determining divergences ($div_x$, $div_y$), of the pair of split radiation beams in substantially mutually orthogonal directions, x and y, respectively, wherein x and y are each substantially orthogonal to the z direction;

determining which one of the divergences has the larger value and which has the smaller;

determining an absolute difference between the values of the divergences;

determining a distance in between the split radiation beams in the x and y direction; and adjusting the beam splitter in accordance with the determined distance, for reducing the difference between the divergences ($div_x$, $div_y$).

23. A method according to claim 22, wherein the direction in which the beam splitter splits the radiation be am is adjustable by rotating the beam splitter with respect to the z direction.

24. A method according to claim 22, wherein the beam splitter comprises a two part axicon and the adjusting comprises changing a distance between a first part and a second part of the axicon.

25. A device manufacturing method comprising:

transmitting a beam of radiation in a first direction (z) using an illumination system;

expanding the radiation beam using a beam expander by a first magnification factor $M_x$ in a second direction (x) and by a second magnification factor $M_y$ in a third direction (y), the second and third directions being substantially mutually perpendicular and substantially perpendicular to the first direction, wherein at least one of $M_x$ and $M_y$ is adjustable;

splitting the radiation beam into two split radiation beams in at least one of the second and third direction, the propagation direction of the split radiation beams being substantially in the first direction;

delivering the split radiation beams to the beam expander;

patterning the beam with a pattern in its cross-section; and projecting the patterned beam of radiation onto a target portion of a substrate.

26. A method according to claim 25, wherein splitting the radiation beam further comprises adjusting a distance between the split radiation beams in at least one of the second and third direction.

27. A method according to claim 25, wherein splitting the radiation beam is performed using a two-part axicon.

28. A method according to claim 27, further comprising rotating at least one part of the axicon with respect to the first direction, such that the radiation beam is split in either the second or the third direction.

* * * * *